US009281368B1

(12) United States Patent
Lee et al.

(10) Patent No.: US 9,281,368 B1
(45) Date of Patent: Mar. 8, 2016

(54) SPLIT-GATE TRENCH POWER MOSFET WITH PROTECTED SHIELD OXIDE

(71) Applicant: Alpha and Omega Semiconductor Incorporated, Sunnyvale, CA (US)

(72) Inventors: Yeeheng Lee, San Jose, CA (US); Lingpeng Guan, San Jose, CA (US); Hongyong Xue, Portland, OR (US); Yiming Gu, Hillsboro, OR (US); Yang Xiang, Beaverton, OR (US); Terence Huang, Portland, OR (US); Sekar Ramamoorthy, Beaverton, OR (US); Wenjun Li, Portland, OR (US); Hong Chang, Saratoga, CA (US); Madhur Bobde, Sunnyvale, CA (US); Paul Thorup, Hillsboro, OR (US); Hamza Yilmaz, Saratoga, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/569,276

(22) Filed: Dec. 12, 2014

(51) Int. Cl.
H01L 21/336 (2006.01)
H01L 29/423 (2006.01)
H01L 29/78 (2006.01)
H01L 29/66 (2006.01)
H01L 21/28 (2006.01)

(52) U.S. Cl.
CPC ...... H01L 29/4236 (2013.01); H01L 21/28008 (2013.01); H01L 29/66484 (2013.01); H01L 29/7831 (2013.01)

(58) Field of Classification Search
CPC .............. H01L 29/407; H01L 29/7813; H01L 29/66727; H01L 29/66734; H01L 29/7811

USPC .................... 438/330–334, 259, 270
See application file for complete search history.

(56) References Cited

U.S. PATENT DOCUMENTS

| 7,892,924 | B1 | 2/2011 | Lee et al. |
| 8,519,476 | B2 | 8/2013 | Chen et al. |
| 8,575,695 | B2 | 11/2013 | Bobde et al. |
| 8,785,278 | B2 | 7/2014 | Yilmaz et al. |
| 8,785,306 | B2 | 7/2014 | Guan et al. |
| 8,803,251 | B2 | 8/2014 | Lee et al. |
| 8,809,948 | B1 | 8/2014 | Yilmaz et al. |
| 8,951,867 | B2 | 2/2015 | Lee et al. |
| 8,969,953 | B2 | 3/2015 | Chen et al. |
| 2011/0233667 | A1* | 9/2011 | Tai .................. H01L 29/407 257/334 |
| 2014/0239388 | A1 | 8/2014 | Lee et al. |
| 2014/0319604 | A1 | 10/2014 | Bhalla et al. |

* cited by examiner

Primary Examiner — Dung Le
(74) Attorney, Agent, or Firm — Joshua D. Isenberg; JDI Patent

(57) ABSTRACT

A plurality of gate trenches is formed into a semiconductor substrate in an active cell region. One or more other trenches are formed in a different region. Each gate trench has a first conductive material in lower portions and a second conductive material in upper portions. In the gate trenches, a first insulating layer separates the first conductive material from the substrate, a second insulating layer separates the second conductive material from the substrate and a third insulating material separates the first and second conductive materials. The other trenches contain part of the first conductive material in a half-U shape in lower portions and part of the second conductive material in upper portions. In the other trenches, the third insulating layer separates the first and second conductive materials. The first insulating layer is thicker than the third insulating layer, and the third insulating layer is thicker than the second.

10 Claims, 6 Drawing Sheets

SPLIT-GATE TRENCH POWER MOSFET WITH PROTECTED SHIELD OXIDE

FIELD OF THE DISCLOSURE

Aspects of the present disclosure relate generally to semiconductor power devices, and more particularly, to split-gate transistor devices and methods of fabricating the same.

BACKGROUND OF THE DISCLOSURE

Power metal oxide semiconductor field effect transistors (MOSFETs) are commonly used power devices due to their low gate drive power, fast switching speed and superior paralleling capability. Most power MOSFETs feature a vertical structure with source and drain regions on opposite sides of a gate trench filled with polysilicon as gate electrodes. In such structures, the MOS channels are formed along the vertical walls of the trenches.

In recent years, split-gate trench structures are developed and are preferred for certain applications over conventional trench MOSFETs because they have good high frequency switching performance and low on-state resistance. A split-gate trench power MOSFET comprises two electrodes in a gate trench. A first electrode serves as the gate electrode to control the channel formation of the MOSFET, and a second electrode serves as shield electrode to decrease the capacitance $C_{gd}$ between drain electrode and gate electrode. Existing fabrication techniques for split-gate trench MOSFETs are typically complex and expensive, usually requiring 8 or more masks to be applied during processing.

It is within this context that embodiments of the present invention arise.

SUMMARY OF THE PRESENT DISCLOSURE

It is therefore an aspect of the present disclosure to provide a new and improved power MOSFET with a poly-protected shield oxide.

Briefly, aspects of the present disclosure include a semiconductor device having a plurality of gate trenches formed into a semiconductor substrate in an active cell region and one or more other trenches formed into the semiconductor substrate in a region other than the active cell region. Each gate trench has a first conductive material in lower portions of the gate trench and a second conductive material in upper portions of the gate trench. The first conductive material in the gate trench is separated from the semiconductor substrate by a first insulating layer. The second conductive material in the gate trench is separated from the semiconductor substrate by a second insulating layer, and separated from the first conductive material in the gate trench by a third insulating layer. Each of the one or more other trenches contains part of the first conductive material in a half U shape in lower portions of the other trench and the second conductive material in upper portions of the other trench. The first conductive material and the second conductive material in the one or more other trenches are separated by the third insulating layer. The first insulating layer is thicker than the third insulating layer, and the third insulating layer is thicker than the second insulating layer.

In some implementations, the semiconductor device includes one or more pickup trenches formed into the semiconductor substrate in a pickup region. The pickup trenches contain at least part of the first conductive material with the first insulating layer separating the part of the first conductive material in the one or more pickup trenches from the semiconductor substrate.

In some implementations, the each of the one or more other trenches has part of the first insulating layer lining along bottom and at least one sidewall of the trench.

In some implementations, the one or more other trenches formed into the semiconductor substrate in a region other than the active cell region are peripheral trenches in a peripheral region, wherein the peripheral region is provided between the active cell region and an edge of the device. In some implementations, the second conductive material in the peripheral trenches is separated from the semiconductor substrate by the second insulating material. In some implementations, each of the peripheral trenches has asymmetrical sidewall insulation with a first insulating layer on a side adjacent to the edge of the device and a second insulating layer on a side adjacent to the active cell region.

In some implementations, the one or more other trenches formed into the semiconductor substrate in a region other than the active cell region are transitional trenches in a pickup region, wherein the transitional trenches are provided between the plurality of gate trenches and a pickup trench. In some implementations, a part of the first conductive material in lower portions of the transitional trenches is in a U shape. In some implementations, a part of the third insulating layer in the transitional trenches is in a U shape.

Another aspect of the present disclosure relates to a method for fabricating a semiconductor device. The method comprises a) forming a plurality of trenches by applying a first mask, the plurality of trenches includes one or more gate trenches located in an active cell region, and one or more transitional trenches and one or more pickup trenches located in a pickup region; b) forming a first conductive region with a first conductive material in the plurality of trenches by applying a second mask, wherein the gate trenches have their first conductive region in lower portions of the gate trenches, the one or more transitional trenches each has a U-shaped first conductive region and the one or more pickup trenches each is filled with the first conductive material; c) forming an intermediate dielectric region for at least some of the trenches of the plurality, wherein the intermediate dielectric region for the one or more transitional trenches is in a U shape; d) forming a second conductive region with a second conductive material in at least some of the trenches of the plurality; e) forming one or more body regions in the active cell region; f) forming source regions in the active cell region using a third mask; g) forming a first electrical contact to the second conductive region in the one or more transitional trenches and to the first conductive region in the one or more pickup trenches by applying a fourth mask; h) forming a second electrical contact to the second conductive region in the gate trenches by applying a fifth mask; i) disposing a metal layer; and j) forming a source metal region and gate metal regions from the metal layer by applying a sixth mask.

These and other aspects of the present disclosure will no doubt become obvious to those of ordinary skill in the art after having read the following detailed description, which is illustrated in the various drawing figures.

DESCRIPTION OF SPECIFIC EMBODIMENTS

Figure 1:
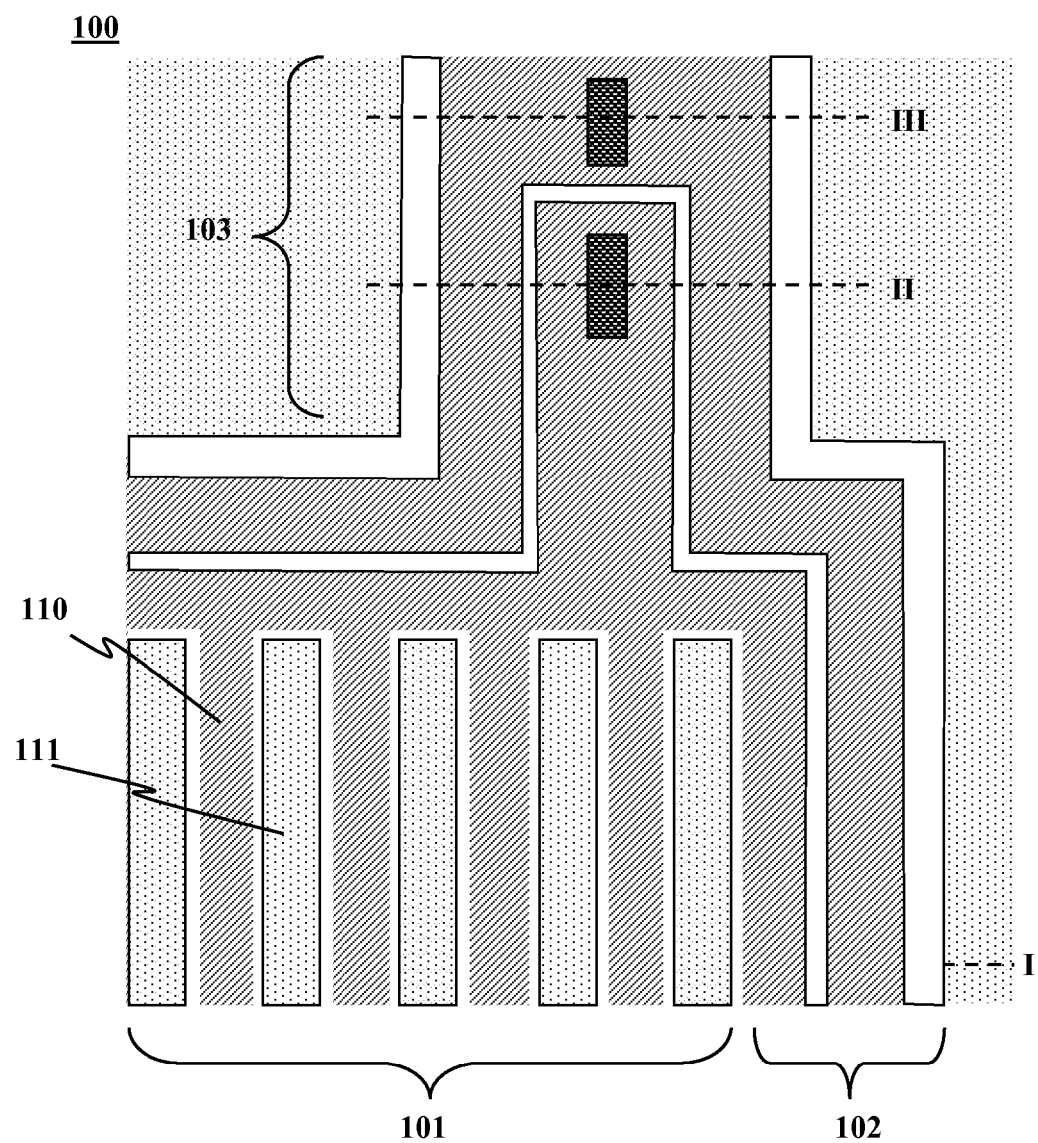
FIG. 1 is a top schematic diagram of a split-gate transistor device according to an aspect of the present disclosure.
Figure 2:
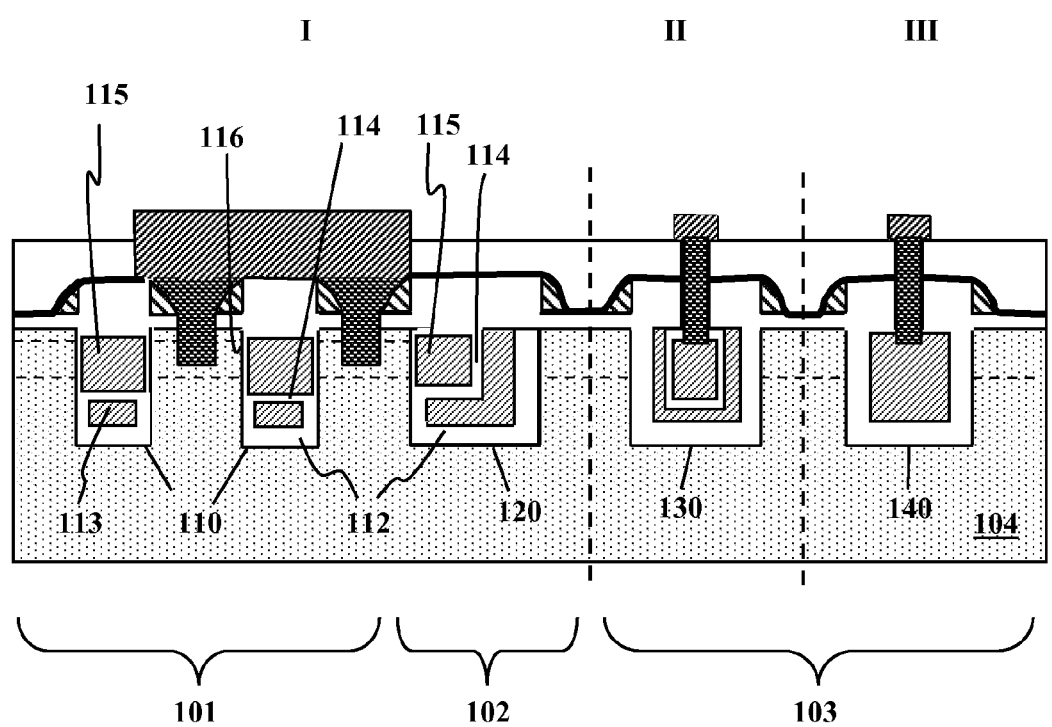
FIG. 2 is a cross-sectional schematic diagram taken along lines I, II and III of FIG. 1.

FIG. 1 is a diagram illustrating a top view of a portion of a split-gate transistor device according to an aspect of the present disclosure. The split gate transistor device 100 of FIG. 1 includes a plurality of split-gate array trenches 110 in the active cell region 101, a peripheral trench in the peripheral region 102 and a transitional array trench and a pickup trench in the pickup region 103. FIG. 2 is a cross-sectional schematic diagram taken along lines I, II and III of FIG. 1. Specifically, in the active cell region 101, each split-gate trench 110 has a bottom electrode 113 (i.e., shield electrode) and a top electrode 115 (i.e., gate electrode). The bottom electrode 113 formed in the bottom portion of the trench is electrically insulated from the semiconductor substrate by a liner insulator material 112 (i.e., liner oxide or shield oxide), such as oxide or nitride, which may coat the wall of the split-gate trench 110 in which the bottom electrode 113 is formed. The top electrode 115 is formed in the top portion of the split-gate trench between the bottom electrode and a surface of the substrate 104. The top electrode 115 is separated from the semiconductor substrate 104 by an insulating material 116 (i.e., gate oxide), such as oxide or nitride and separated from the bottom electrode 113 by an inter-poly dielectric layer 114. In some implementations, the gate oxide 116 has a thickness less than that of the inter-poly dielectric layer 114, and the inter-poly dielectric layer 114 has a thickness less than that of the liner insulator 112.

A peripheral trench 120 is formed in the peripheral region 102. The peripheral trench is lined with liner oxide 112 on the bottom and on the sidewall adjacent to the edge of the device and the bottom sidewall adjacent to the gate trench 110 and lined with gate oxide 116 along the upper sidewall adjacent to the gate trench 110. The gate electrode 115 in the peripheral trench 120 is provided in the upper corner close to the gate trench 110, and the shield electrode 113 is in a half U-shape under the gate electrode 115 with a half U-shaped inter-poly dielectric layer 114 separating the gate electrode 115 and the shield electrode 113.

A transitional trench 130 and a pickup trench 140 are formed in the pickup region 103. The transitional trench 130 has a liner insulator 112, e.g., an oxide, along sidewalls and bottom of the trench. The gate electrode 115 in the transitional trench 130 is provided in the middle upper portion of the trench and the shield electrode 113 is in a U shape with the gate electrode 115 nested within an opening of the U shape. A U-shaped intermediate dielectric layer 114 separates the gate electrode 115 and the shield electrode 113. The pickup trench 140 contains a shield electrode 113 with a liner insulator 112 along sidewalls and bottom of the trench.

Figure 3A:
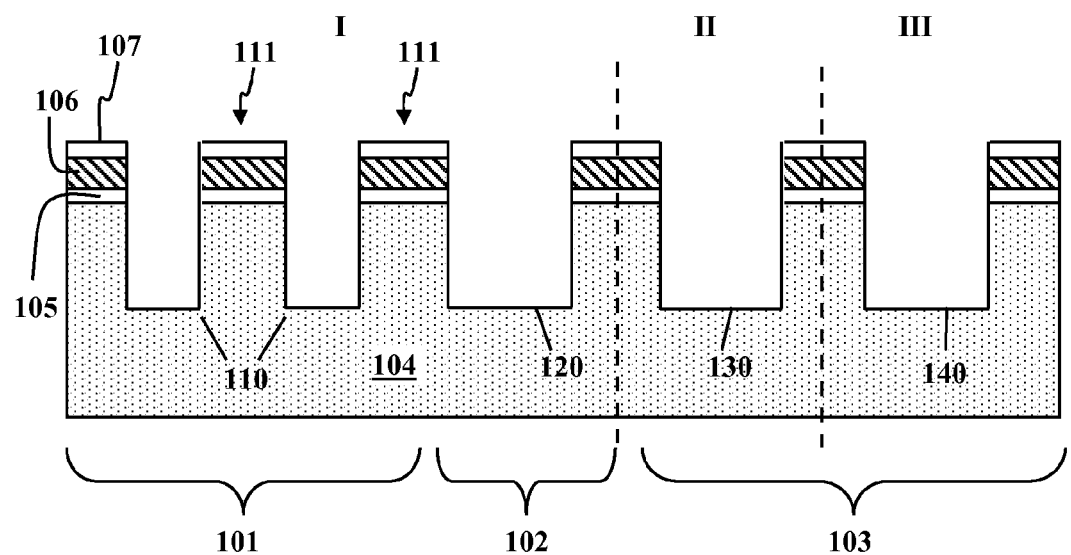
FIG. 3A-3H are cross-sectional schematic diagram taken along lines I, II and III of FIG. 1 illustrating fabrication process of a split-gate transistor device according to an aspect of the present disclosure.

FIG. 3A-3H are cross-sectional schematic diagram taken along lines I, II and III of FIG. 1 illustrating fabrication process of a gate transistor device according to an aspect of the present disclosure. An N-type device is described for purposes of illustration. It should be noted that P-type devices may be fabricated using a similar process but with the opposite conductivity type. In FIG. 3A, an N-type substrate 104 (e.g., an N+ silicon wafer with an N− epi layer grown on it) is used as the drain of the device. In some embodiments, the doping concentration for the upper portions of the substrate 104 is approximately $1\times10^{16}$-$1\times10^{17}$/cm$^3$, with thickness of 2-4 μm. A hard mask layer can be formed on top of the substrate 104, for example, by forming a thin oxide layer 105 on the substrate 104 by deposition or thermal oxidation, followed by a nitride layer 106 on top of the thin oxide layer 105. In some embodiments, the thickness of the silicon oxide layer 105 ranges from about 100 Å to 500 Å and is preferably about 200 Å. In some embodiments, the thickness of the nitride layer 106 ranges from 1500 Å to 4000 Å and is preferably about 3500 Å. Another oxide layer 107 may be disposed on top of the nitride layer 106 to form the hard mask with an oxide/nitride/oxide stack. In some embodiments, the thickness of the oxide layer 107 ranges from 1000 Å to 3000 Å and is preferably about 2000 Å. A photo resist layer (not shown) is then applied on top of the oxide/nitride/oxide stack and patterned using a trench mask. A hard mask etch is then performed to etch away exposed portions of the nitride layer 106 and oxide layers 107 and 105 and the etching stops at the silicon surface leaving openings that will be used to mask the etching of trenches. The trench openings are etched into the semiconductor substrate 104 forming gate trenches 110 in active cell region 101, a peripheral trench 120 in the peripheral region 102 and a transitional trench 130 and a pickup trench 140 in the pickup region 103. In some embodiments, the target depth of these trenches is approximately 0.6-1.5 μm, preferably about 1.0 μm. Regions 111 of the substrate between the gate trenches 110 or between a gate trench 110 and the peripheral trench 120 are sometimes referred to herein as mesa regions.

Figure 3B:
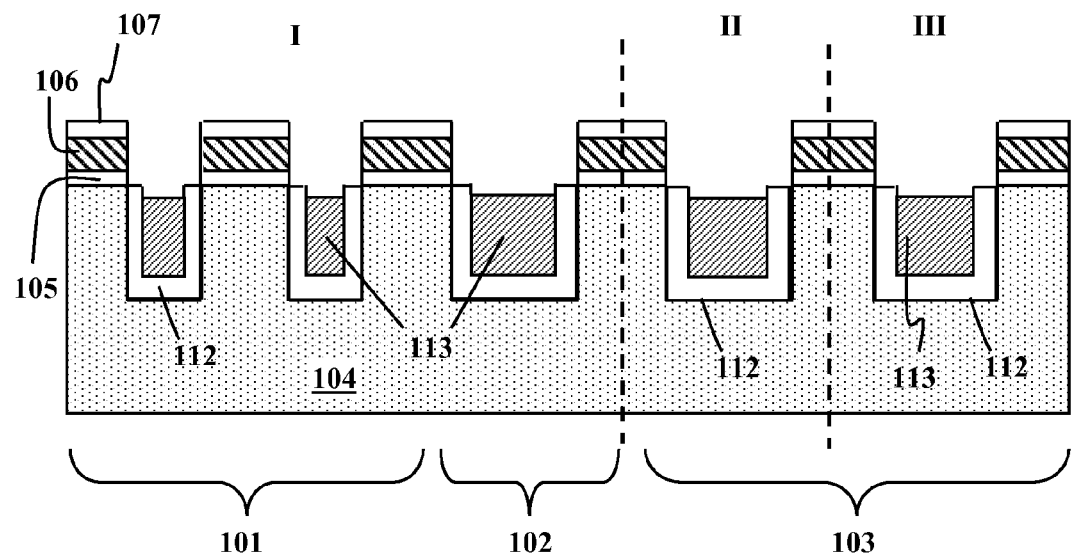

In FIG. 3B, an oxidation is performed to grown a liner oxide layer 112. A thick liner insulator layer 112 is grown on the trench walls to a thickness based on device optimization for low $R_{ds}$ and high breakdown voltage. In some embodiments, the thickness of the liner insulator layer 112 is about 400-800 Å and preferably 600 Å. Next, a first conductive material 113, such as polysilicon, is deposited into the trenches and over the semiconductor substrate 104 followed by a chemical mechanical polishing (CMP) to remove polysilicon over the oxide layer 107 leaving the conductive material only in the gate trenches 110, the transitional trench 130 and the pickup trench 140. The first conductive material layer 113 in the trenches 110, 130 and 140 is then etched back and the etching stops at 100-600 Å below the surface of the substrate 104, e.g., about 300 Å below the surface of the substrate 104. This first layer of conductive material 113 is sometimes referred to as source poly, shield poly or Poly 1.

Figure 3C:
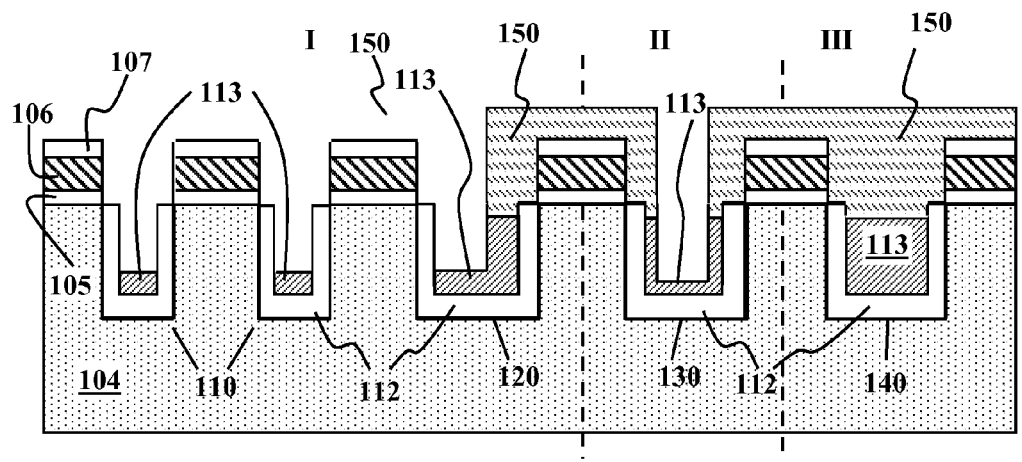

With reference to FIG. 3C, a photo resist layer 150 (e.g., poly 1 mask) is applied on top of portions of the oxide/nitride/oxide stack to cover the pickup trench 140, two sides of the transitional trench 130 and one side of the peripheral trench 120 that is adjacent to the edge of the device. The exposed first conductive material 113 is then etched back in the upper portions of the gate trenches 110 and the peripheral trench 120 and the transitional trench 130 as shown in FIG. 3C. The photoresist layer 150 is patterned in a way that protects the liner insulator 112 and at least a portion of the first conductive material 113 in the peripheral trench 120, the transitional trench 130 and the pickup trench 140 as the etching leaves a half U-shaped conductive material 113 in the peripheral trench 120 and a U-shaped conductive material 113 in the transitional trench. In one example, the first conductive material layer 113 may be etched to a target depth using a timed etch-back process. In some embodiments, the conductive material layer 113 is etched to a depth about 0.55 μm below the surface of the semiconductor substrate 104.

Figure 3D:
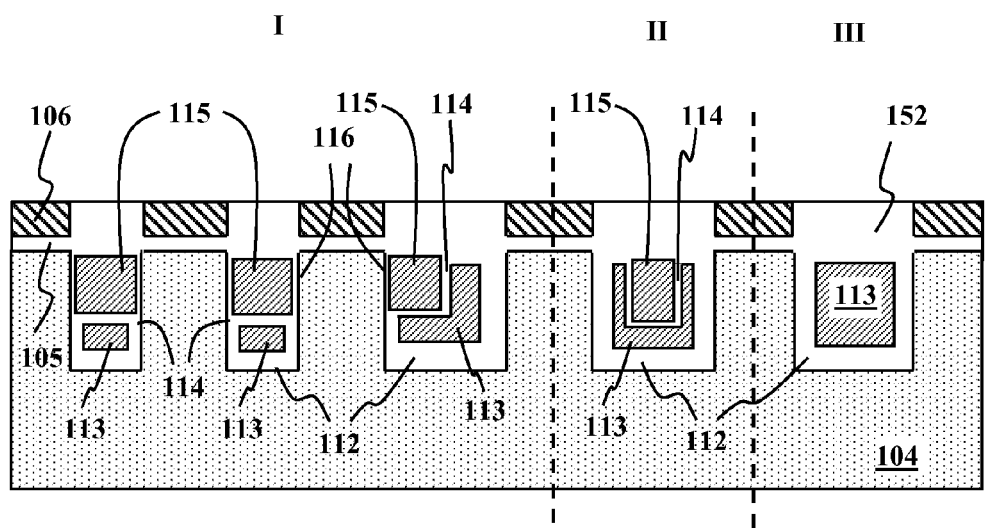

With reference to FIG. 3D, the exposed liner insulator 112 along the etched upper portion of the gate trenches 110 and the peripheral trench 120 is stripped, e.g., using a wet etch. A thin insulating layer 116 (e.g., gate oxide) is formed to cover the upper portion of trench walls of the gate trenches 110. In addition, the upper portion of the trench wall next to the gate trench 110 of the peripheral trench 120 is also lined with the gate insulator 116. Next, an intermediate dielectric layer 114 is formed atop the bottom portion of the first conductive material layer 113 of the split-gate trenches 110. The intermediate dielectric layer 114 is also formed along the conductive material layer 113 in the peripheral trench 120 and the transitional trench 130 (e.g., by oxidation) such that the intermediate dielectric layer 114 is in a half U shape in the peripheral trench 120 and in a U shape in the transitional trench 130. The gate oxide 116 is about 150 to 500 Å in thickness and the inter-poly dielectric layer 114 is about 250 to 800 Å in thickness.

A second layer of conductive material 115, such as polysilicon is deposited into upper portion of the trenches 110, 120 and 130 and over the substrate 104 followed by a CMP to remove polysilicon over the oxide layer 107 and the photo resist layer 150. In the particular case of polysilicon, this second layer of conductive material 115 is sometimes referred as gate poly or Poly 2. The second conductive layer 115 (sometimes referred to herein as the gate conductor) is then etched back to about 100 Å-600 Å, e.g., about 300 Å below the surface of the substrate so that the upper surface of the second conductive material in the trenches 110, 120 and 130 is recessed below the top surface of the semiconductor substrate 104. After removing the photo resist 150, another oxidation step is performed in the trenches 110, 120, 130 and 140 forming the insulating layer 152 followed by a CMP to remove oxides 152 and oxide layer 107 above the nitride layer 106.

Figure 3E:
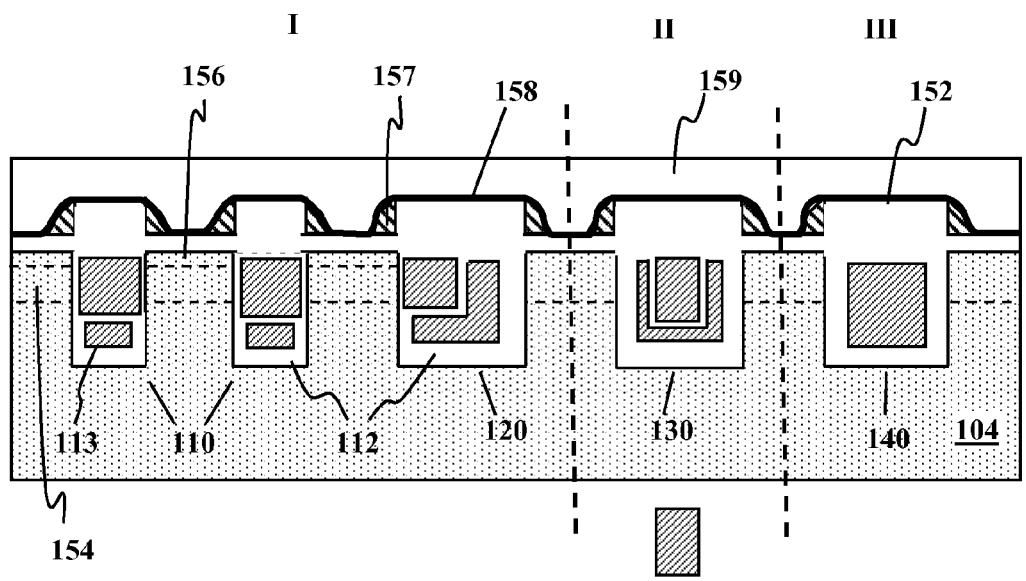

With reference to FIG. 3E, the nitride layer 106 is stripped using a wet etch. A body dopant implant may then be performed to form a plurality of body regions. This implant may be carried out, e.g., by a blanket implant followed by a body diffusion to form the body region 154. The body drive diffuses the dopant to a desired depth. Then a source mask is applied to carry out a source dopant implant to form a plurality of source regions 156 in the active cell region 101. A layer of nitride is deposited over the top of the structure. In one example, the thickness of the nitride layer is about 600 to 1200 Å, e.g., about 900 Å. The nitride layer is anisotropically etched back along the horizontal surface to form nitride spacers 157 along the walls next to the oxides 152. Following that, a stop layer of nitride 158 is deposited on top of the structure. In one example, the thickness of the nitride stop layer 158 is about 200 Å to 500 Å, e.g., about 300 Å. Next a low temperature oxide (LTO) layer and a borophosphosilicate glass (BPSG) layer 159 are deposited as shown in FIG. 3E.

Figure 3F:
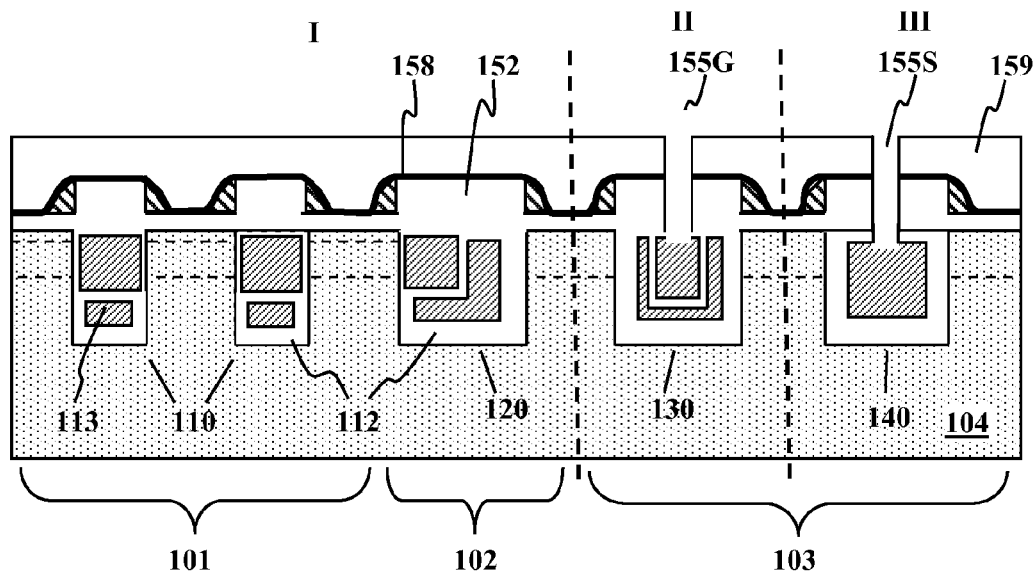

With reference to FIG. 3F, a first contact mask is applied. In the pickup region 103, an etch step is performed to etch ONO stack (LTO layer 159, nitride stop layer 158, oxide 152) to reach the surface of the top conductive material (i.e., the conductive material 115 in the transitional trench 130 and the conductive material 113 in the pickup trench 140) forming contact openings 155S and 155G through the LTO layer 159 to allow for contact to the shield conductor 113 and gate conductor 115, respectively, at regions II and III.

Figure 3G:
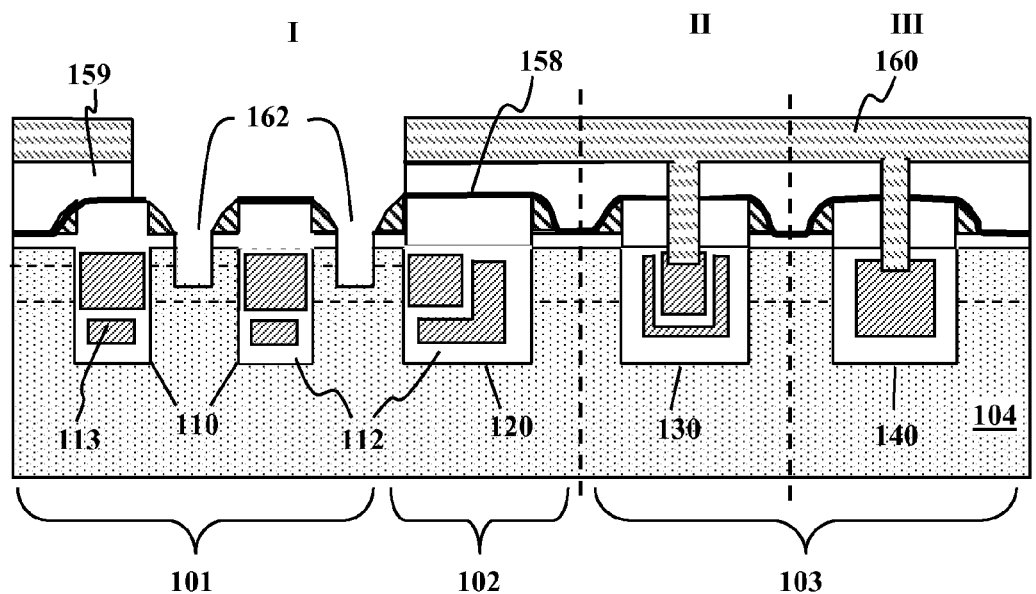

In FIG. 3G, another contact mask 160 is applied and another etch process is performed to open the arrays of source and body contact openings in the mesa regions 111 between the gate trenches 110 in the active cell region 101. Specifically, the etching process starts with removal the LTO layer 159 and stops at the nitride stop layer 158. Following a breakthrough of nitride 158, the contact trenches 162 are formed.

Figure 3H:
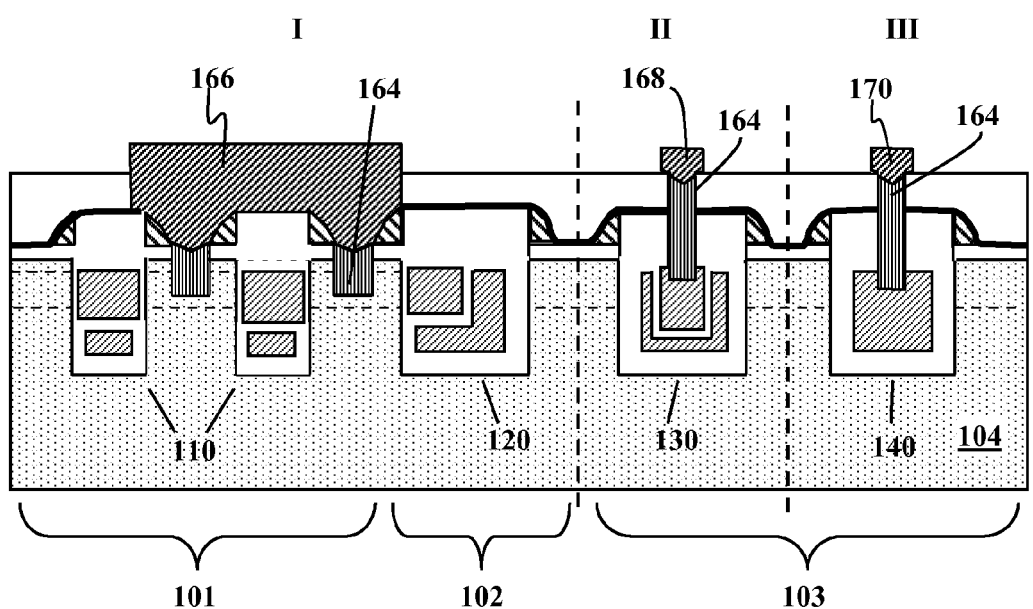

Next, a barrier metal (not shown) is lined on the sidewalls and bottom of the contact openings 155S and 115G and contact trenches 162 followed by the deposition of a conductive material, e.g., tungsten, in the contact openings and contact trenches forming the conductive plugs 164. A layer of metal is deposited. A metal mask is used and an etch process is performed to form a source metal region 166 and gate metal regions 168 and 170. The conductive plugs 164 are formed in the connected to the metal regions as shown in FIG. 3H. The wafer is then followed the rest of standard trench MOSFET steps to complete the processing.

The fabrication process according to the present disclosure allows the thick liner insulator 112 to be preserved using one less mask. It does not need a P-cover mask to protect the liner oxide 112 in the peripheral trench 120. This makes the process less expensive. The conductive material 113 that forms the shield electrode protects the liner insulator 112 during the insulator etch process that forms openings for contacts to the shield conductor 113 and the gate conductor 115.

Although the present invention has been described in terms of the presently preferred embodiment, it is to be understood that such disclosure is not to be interpreted as limiting. For example, although n-channel devices are described above, aspects of the present disclosure can be implemented as p-channel devices as well simply by reversing the conductivity types of the doped regions described above. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for fabricating a semiconductor device, comprising:
    forming a plurality of trenches in a semiconductor substrate by applying a first mask, the plurality of trenches includes at least gate trenches located in an active cell region, and one or more transitional trenches and one or more pickup trenches located in a pickup region;
    forming a first conductive region with a first conductive material in the plurality of trenches by apply a second mask, wherein the gate trenches have their first conductive region in lower portions of the gate trenches, the one or more transitional trenches each has a U-shaped first conductive region and the one or more pickup trenches each is filled with the first conductive material;
    forming an intermediate dielectric region for at least some of the trenches of the plurality, wherein the intermediate dielectric region for the one or more transitional trenches is in a U shape;
    forming a second conductive region with a second conductive material in at least some of the trenches of the plurality;
    forming a body region in the semiconductor substrate;
    forming source regions in the active cell region by applying a third mask;
    forming a first electrical contact to the second conductive region in the one or more transitional trenches and to the first conductive region in the one or more pickup trenches by applying a fourth mask;
    forming a second electrical contact to the second conductive region in the gate trenches by applying a fifth mask;
    disposing a metal layer; and
    forming a source metal region and gate metal regions from the metal layer by applying a sixth mask.

2. The method of claim 1, wherein the plurality of trenches further includes one or more peripheral trenches in a peripheral region between the active cell region and an edge of the semiconductor device, wherein the one or more peripheral trenches each has a half U-shaped first conductive region.

3. The method of claim 1, wherein the one or more pickup trenches are connected to the one or more gate trenches, wherein the one or more pickup trenches contain at least part of the first conductive material with a first insulating layer separating the part of the first conductive material in the one or more pickup trenches from the semiconductor substrate.

4. The method of claim 3, wherein each of the trenches has part of the first insulating layer lining a bottom and at least one sidewall of the trench.

5. The method of claim 3, wherein the one or more transitional trenches include a trench located between the active cell region and an edge of the device.

6. The method of claim 5, wherein the part of a second conductive material in the peripheral trenches is separated from the semiconductor substrate by the second insulating material.

7. The method of claim 5, wherein each of the peripheral trenches has asymmetrical sidewall insulation with the first insulating layer on a side adjacent to the edge of the device and a second insulating layer on a side adjacent to the active cell region.

8. The method of claim 1, wherein the transitional trenches are provided between the plurality of gate trenches and a pickup trench.

9. The method of claim 8, wherein a part of the first conductive material in lower portions of the transitional trenches is in a U shape.

10. The method of claim 8, wherein a part of the intermediate dielectric region in the transitional trenches is in a U shape.

* * * * *